INVENTOR
P.S. Hessinger
by
Green & Durr
ATTORNEYS.

United States Patent Office 3,546,543

Patented Dec. 8, 1970

3,546,543

HERMETICALLY SEALED ELECTRONIC PACKAGE FOR SEMICONDUCTOR DEVICES WITH HIGH CURRENT CARRYING CONDUCTORS

Philip S. Hessinger, West Caldwell, N.J., assignor to National Beryllia Corp., Haskell, N.J., a corporation of New Jersey Filed Aug. 30, 1968, Ser. No. 756,587
Int. Cl. H01l 3/00, 5/00
U.S. Cl. 317—234 2 Claims

ABSTRACT OF THE DISCLOSURE

The combination of an hermetically sealed electronic package with a sealed-in conductor of high current-carrying capacity extending from the interior of the package to the exterior thereof, is obtained by flattening and slotting the conductor in the region where it passes between two of the parts of the package which are sealed together.

This invention relates to an hermetically sealed electronic package such as a semiconductor package which has one or more conductors extending through insulating layers of the same from the interior of the package to the exterior thereof.

Due to the extreme mismatch of the thermal expansion rate between a conducting metal wire and a glass and/or other ceramic substrate or sealing ring, a problem exists in obtaining a tight seal around the conductor which is necessary to connect the sealed-in device or circuit to the outside. Conventional seals provide a conductor element of thin cross-section, which improves the ductility of the conductor and helps compensate for the expansion difference. Thin conductors obviously have limited current carrying capacities and there is a need for sealed-in conductors of higher current carrying capacities.

Among the objects of the present invention is to provide an hermetically sealed, electronic package with a sealed-in conductor of high current carrying capacity.

Among other objects of the invention is to provide a process of hermetically sealing a conductor element between two insulating layers of ceramic.

The term "ceramic" as applied to bases, substrates, rings, etc., will be understood to include glass as well as the sintered bodies prepared by ceramic processes from refractory oxides, silicates and similar refractory compounds generally referred to as ceramics.

The objects of the invention are attained by flattening, longitudinally and dividing an intermediate portion of a conductor wire or element of relative large, cross-sectional area (which normally is essentially two-dimensional in cross-section), without substantially changing the total cross-sectional area at the flattened portion and then sealing the flattened portion of the conductor between the two layers of insulating materials so as to close and seal all of the space between the divided portions thereof. When it is stated that the conductor is wrie-like or two-dimensional in cross-section, it is meant that said cross-section has substantial depth as well as width.

Examples of ceramics that can be employed as a substrate or other layer of the package include beryllia, alumina, thoria, steatite ($MgO \cdot SiO_2$), forsterite $$(2MgO \cdot SiO_2)$$

wollastonite ($CaO,SiO_2$), etc., as well as various mixtures of such oxide materials. Any of the commercially available glasses compounded for their insulating and sealing properties can be employed with this invention.

The conductor element may be copper, copper alloys, silver, silver alloys, aluminum, aluminum alloys, Kovar, an iron-nickel-cobalt alloy, or any of the precious metals of high conductivity.

For a better understanding of the nature, scope and characteristic features of my present invention, reference may now be had to the following description and accompanying drawings in which.

Figure 1:
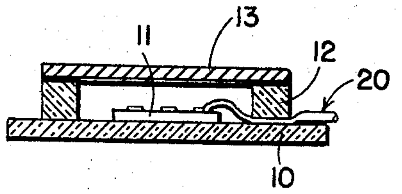
FIG. 1 is a side cross-sectional view of a typical electronic package embodying the principal of the present invention.

A typical electronic package, as shown in FIG. 1, comprises a glass or ceramic base 10, having a circuit device 11 soldered thereto, a glass or ceramic ring 12 surrounding the device 11 and sealed to the base 10, with the conductor element 20 sealed between said ring 12 and the base 10. The top 13 can be of metal, glass or ceramic, or may be integral with the ring 20. Where the top 13 is a metal plate, as shown, it can be brazed or solder sealed to the top of the insulating ring 12.

Figure 2:
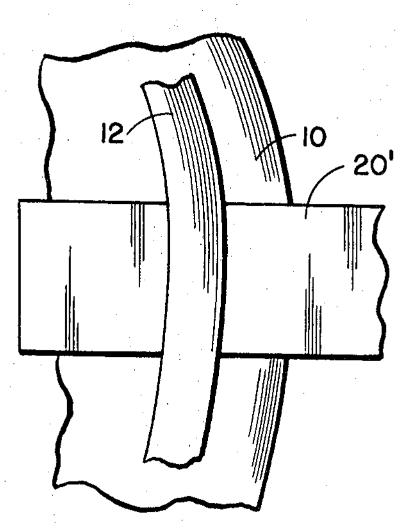
FIG. 2 PRIOR ART
FIG. 2 is a greatly enlarged detail view of a device similar to that of FIG. 1 but showing the cover removed and showing the prior art device.

A typical conducting ribbon 20' of a size required for relatively high current carrying capacity is shown in FIG. 2. In said prior art device of FIG. 2 there is a large area on both sides of said ribbon conductor 20', over the entire area of which a tight seal must be maintained. Thus, the total transverse expansion of said ribbon 20' on heating or contraction on cooling is fairly large compared to the corresponding expansion of the base 10 or the ring 12 and the forces resulting from transverse expanding or contracting of integral parts across the ribbon are accumulative so that relatively large forces are inclined to build up at one or both sides of the ribbon 20'.

Figures 3, 4:
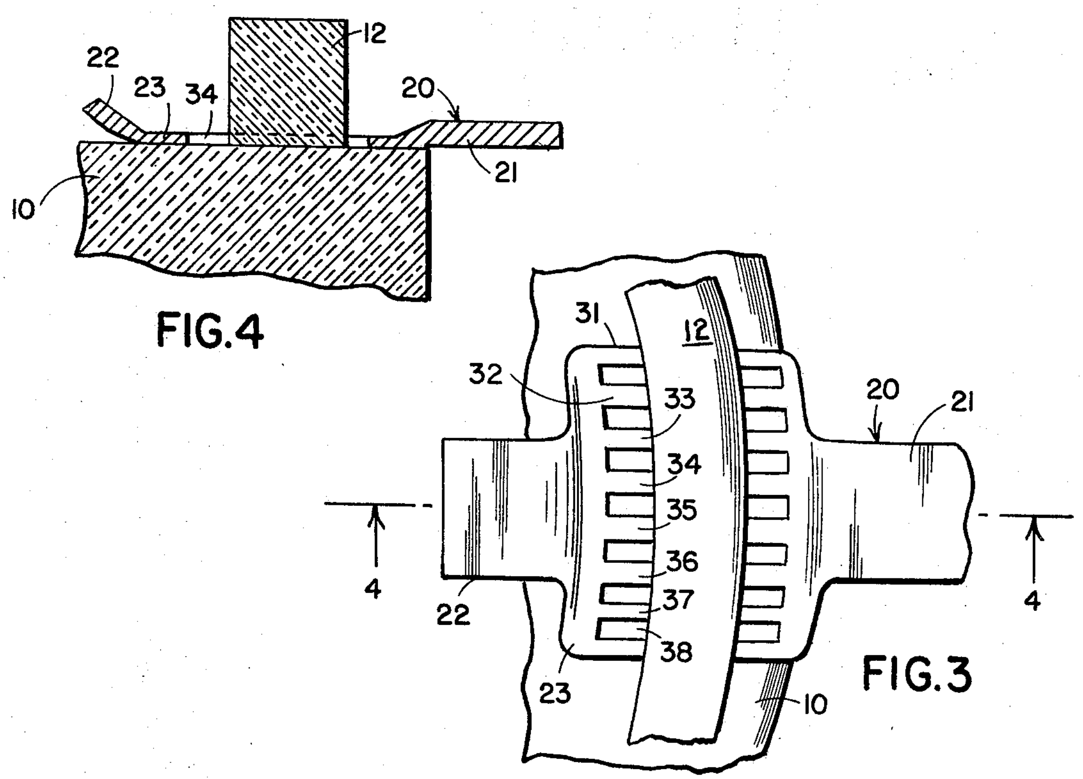
FIG. 3 is an enlarged detail view similar to FIG. 3, but illustrating the present invention.
FIG. 4 is a cross-sectional view taken on line 4—4 of FIG. 3.

In the structure of the invention as illustrated in detail in FIGS. 3 and 4, the conductor 20 has a portion 21 that is round, oval, or two-dimensional in cross-section extending outside of the package, a similar round, oval or two-dimensional section 22 inside of the package and an intermediate flattened section 23 which comprises separated ribbon parts 31–38 that pass between the base 10 and the ring 12. Eight separate ribbon parts 31–38 are shown, but it will be understood that the number of separations is quite variable and even that with a single separation, i.e., with only two separate ribbons, a significant improvement is noted.

The features and principles underlying the invention described above in connection with specific exemplifications will suggest to those skilled in the art many other modifications thereof. It is accordingly desired that the appended claims shall not be limited to any specific features or details thereof.

I claim:

1. In an electronic package of the type having an insulating ceramic base, an electronic component or circuit within the confines of the base, an enclosing means comprising a ceramic ring surrounding the electronic component and hermetically sealed to the base, and a conductor element extending from inside the enclosing means through a space between the base and the ceramic ring to the outside of said enclosing means, the improvement comprising, a conductor element having a total cross-sectional area throughout its length of relatively large size for high current carrying capacity, said conductor element having (a) a first portion which extends outside of the enclosing means which is essentially wire-like or two-dimensional in cross-section, (b) a second portion which extends inside of the enclosing means which is also essentially wire-like or two-dimensional in cross-section and an intermediate position between the first and second portions which is flattened, said intermediate portion including at least one longitudinal slot which divides the inner part of the flattened portion into longitudinal ribbons of limited transverse dimensions whereby the hermetic seal between the base and the ring extends into the slots of the intermediate portion of said conductor element.

2. A process of hermetically sealing a conductor of high current carrying capacity into an electronic package of the type having an insulating ceramic base, an electronic component within the confines of the base, an enclosing means comprising a ceramic ring surrounding the electronic component, with said conductor element extending from the electronic component through the seal between the base and the enclosing means, comprising, providing a conductor element having wire-like end portions and a flattened intermediate portion of substantially the same cross-sectional area as the end portions, said flattened intermediate portion including at least one longitudinal slot, sealing the enclosing means to the base portion with the intermediate portion of the conductor element passing therebetween, the ceramic ring of the enclosing means being sealed to the base portion in the region of the slots of the flattened intermediate portion of the conductor element.

References Cited

UNITED STATES PATENTS

| | | | |
|---|---|---|---|
| 3,283,224 | 11/1966 | Erkan | 317—234 |
| 3,287,610 | 11/1966 | Reber | 317—234 |
| 3,312,771 | 4/1967 | Hessinger et al. | 317—234 |
| 3,353,073 | 11/1967 | Majima et al. | 317—234 |
| 3,404,215 | 10/1968 | Burks et al. | 317—234 |
| 3,450,965 | 6/1969 | Kubota | 317—234 |
| 3,404,319 | 10/1968 | Tsuji et al. | 317—234 |

FOREIGN PATENTS

| | | | |
|---|---|---|---|
| 1,254,773 | 11/1967 | Germany | 317—234 |

JOHN HUCKERT, Primary Examiner

A. J. JAMES, Assistant Examiner

U.S. Cl. X.R.

174—52; 317—101